United States Patent
Ku et al.

(10) Patent No.: US 12,354,975 B2
(45) Date of Patent: Jul. 8, 2025

(54) GUARD RING STRUCTURE

(71) Applicant: Taiwan Semiconductor Manufacturing Company, Ltd., Hsinchu (TW)

(72) Inventors: Min-Feng Ku, Hsinchu (TW); Yao-Chun Chuang, Hsinchu (TW); Cheng-Chien Li, Hsinchu (TW); Ching-Pin Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 453 days.

(21) Appl. No.: 17/693,027

(22) Filed: Mar. 11, 2022

(65) Prior Publication Data

US 2023/0163084 A1    May 25, 2023

Related U.S. Application Data

(60) Provisional application No. 63/282,227, filed on Nov. 23, 2021.

(51) Int. Cl.
*H01L 23/58* (2006.01)
*H01L 21/76* (2006.01)
(Continued)

(52) U.S. Cl.
CPC ...... *H01L 23/585* (2013.01); *H01L 21/76832* (2013.01); *H01L 21/76877* (2013.01); *H01L 21/76898* (2013.01); *H01L 23/481* (2013.01)

(58) Field of Classification Search
CPC ........... H01L 23/49827; H01L 23/5384; H01L 21/76877; H01L 23/585
See application file for complete search history.

(56) References Cited

U.S. PATENT DOCUMENTS 7,633,165 B2    12/2009    Hsu et al.
8,202,800 B2    6/2012    Chen et al.
(Continued)

FOREIGN PATENT DOCUMENTS

CN    100385627 C * 4/2008 ....... H01L 21/76801
DE    102021100457 A1    7/2022
(Continued)

OTHER PUBLICATIONS

Min-Feng Kao et al., Through Silicon Vias and Methods of Fabricating Thereof, U.S. Appl. No. 17/465,232, filed Sep. 2, 2021, Assignee: Taiwan Semiconductor Manufacturing Company, Ltd., 48 pages specification, 36 pages drawings.

*Primary Examiner* — Walter H Swanson
*Assistant Examiner* — Moataz Khalifa
(74) *Attorney, Agent, or Firm* — HAYNES AND BOONE, LLP

(57) ABSTRACT

Integrated circuit (IC) structures and methods for forming the same are provided. An IC structure according to the present disclosure includes a substrate, an interconnect structure over the substrate, a guard ring structure disposed in the interconnect structure, a via structure vertically extending through the guard ring structure, and a top metal feature disposed directly over and in contact with the guard ring structure and the via structure. The guard ring structure includes a plurality of guard ring layers. Each of the plurality of guard ring layers includes a lower portion and an upper portion disposed over the lower portion. Sidewalls of the lower portions and upper portions of the plurality of guard ring layers facing toward the via structure are substantially vertically aligned to form a smooth inner surface of the guard ring structure.

20 Claims, 14 Drawing Sheets

(51) Int. Cl.
*H01L 21/768* (2006.01)
*H01L 23/48* (2006.01)

(56) References Cited

U.S. PATENT DOCUMENTS

| | | | |
|---|---|---|---|
| 11,094,650 B1 | 8/2021 | Liu | |
| 2010/0187671 A1* | 7/2010 | Lin | H01L 21/76898 |
| | | | 257/773 |
| 2014/0038390 A1* | 2/2014 | Yang | H01L 24/73 |
| | | | 438/462 |
| 2015/0348874 A1* | 12/2015 | Tsai | H01L 21/76898 |
| | | | 257/774 |
| 2016/0133583 A1 | 5/2016 | Chen | |
| 2017/0154850 A1 | 6/2017 | Kao et al. | |
| 2018/0233405 A1 | 8/2018 | Watanabe | |
| 2019/0385951 A1* | 12/2019 | Chu | H01L 23/5386 |
| 2019/0393170 A1 | 12/2019 | Nyhus | |
| 2020/0083388 A1 | 3/2020 | Aketa | |

FOREIGN PATENT DOCUMENTS

| | | |
|---|---|---|
| JP | 2015076502 A | 4/2015 |
| KR | 20150058778 A | 5/2015 |
| TW | 201607025 A | 2/2016 |
| TW | 201807806 A | 3/2018 |
| TW | 202117868 A | 5/2021 |
| TW | 202131471 A | 8/2021 |
| TW | 202141638 A | 11/2021 |
| WO | 2011001520 A1 | 1/2011 |

* cited by examiner

GUARD RING STRUCTURE

PRIORITY DATA

This application claims the benefit of U.S. Provisional Application No. 63/282,227, filed Nov. 23, 2021, which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Through substrate vias (TSVs) are commonly used in 3DICs because they route electrical signal from one side of a silicon substrate of an IC to the other side thereof. The formation of TSVs may generate stress on surrounding structures, causing delamination and failures. Protective structures have been developed to reduce, absorb, or isolate the stress generated by TSVs. While existing protective structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
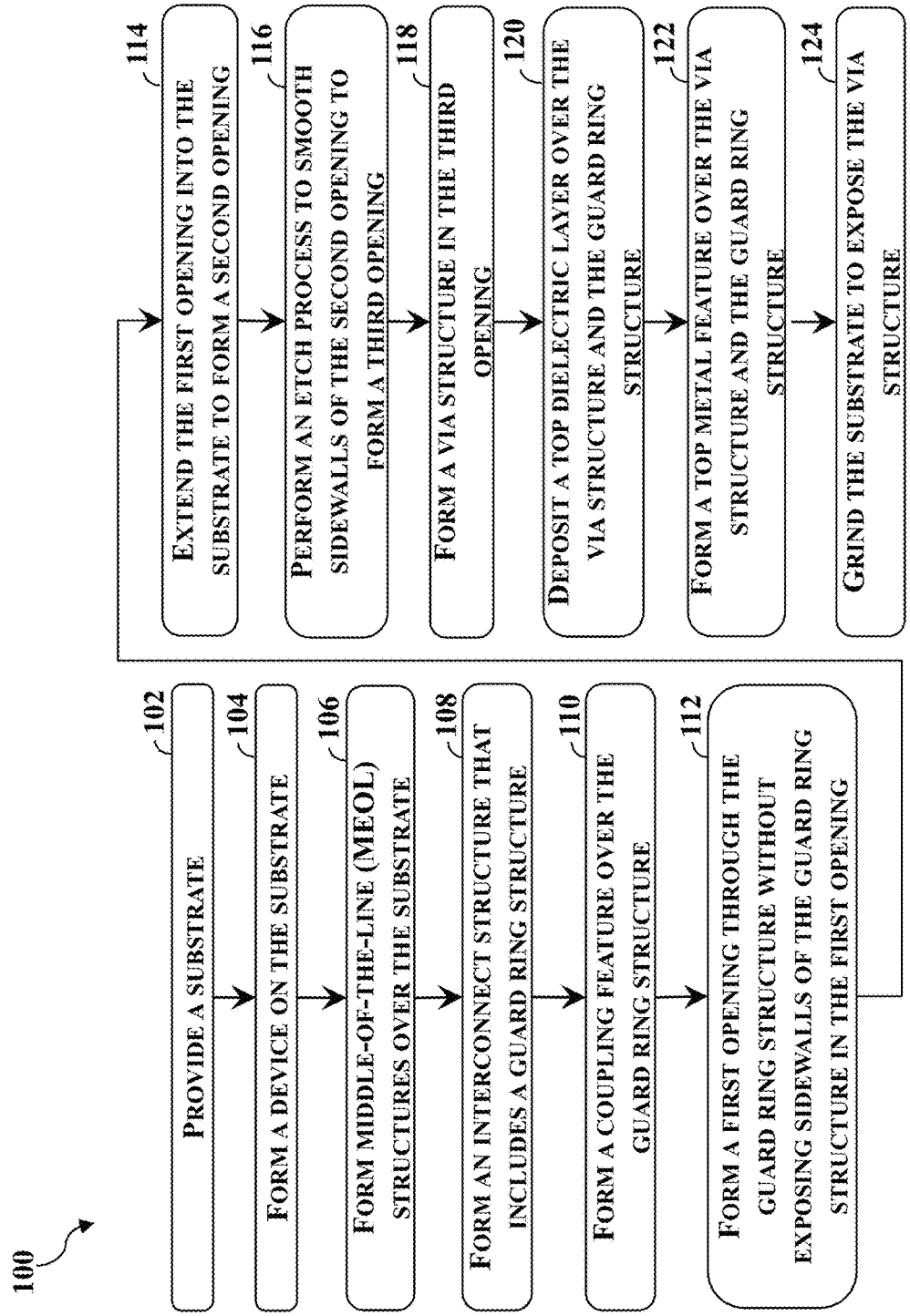
FIG. 1 is a flow chart illustrating an embodiment of a method of forming a device structure and a via structure through the device structure, according to various aspects of the present disclosure.

The present disclosure relates generally to integrated circuit devices, and more particularly, to interconnect structures for integrated circuit devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An interconnect structure electrically couples various components (for example, transistors, resistors, capacitors, and/or inductors) fabricated on a substrate, such that the various components can operate as specified by design requirements. An interconnect structure includes a combination of dielectric layers and conductive layers configured to provide electrical signal routing. The conductive layers include via and contact features that provide vertical connections and conductive lines that provide horizontal connections. In some implementations, an interconnect structure may have eight (8) to thirteen (13) levels of metal layers (or metallization layers) that are vertically interconnected by via or contact features. During operation of the IC device, the interconnect structure routes signals among the components of the IC device and/or distribute signals (for example, clock signals, voltage signals, and/or ground signals) to the components. An interconnect structure is formed in a back-end-of-the-line (BEOL) process, typically formed after the front-end-of-the-line (FEOL) process forms the active devices such as a transistor on a substrate and the middle-end-of-the-line (MEOL) process forms source/drain contacts and gate contacts.

In some implementations, it is desirable to provide a vertical interconnect that extends through the interconnect structure and/or the substrate to facilitate various device structures, such as CMOS image sensors (CISs), a three-dimensional integrated circuit (3DIC), MEMS devices, radio frequency (RF) devices, wafer-on-wafer (WoW) devices, and so on. Such a vertical interconnect may be referred to as a through-silicon or through-substrate via (TSV) as it extends through, in whole or in part, the semiconductor substrate. The term TSV in the present disclosure broadly encompasses via structures that provide direct signal routing from a frontside of the substrate to a backside of the substrate or vice versa.

The present disclosure provides an enclosure structure around sidewalls and a top surface of a TSV that extends through an interconnect structure and a substrate underlying the interconnect structure. In one embodiment, the enclosure structure includes a guard ring structure that surrounds the TSV and a top metal feature that is disposed on the guard ring structure and the TSV. In implementations where both the guard ring structure and the TSV are circular in a top view, the TSV extends through a center of the guard ring structure and is radially spaced apart from the guard ring structure by dielectric layers in the interconnect structures. The top metal feature is coupled to the guard ring structure and the TSV to eliminate the stray or parasitic capacitance between the guard ring structure and the TSV. The diameters of the guard ring structure and the TSV are selected such that the dielectric layers between the TSV and the guard ring structure have a sufficient thickness along the radial direction to reduce or absorb the stress exerted by the TSV to surrounding structures.

The various aspects of the present disclosure will now be described in more detail with reference to the figures. In that regard, FIG. 1 is a flowchart illustrating a method 100 of forming a device structure from a workpiece 200 (shown in FIGS. 2-13) and a via structure through the device structure, according to various aspects of the present disclosure. Method 100 is merely an example and is not intended to limit the present disclosure to what is explicitly illustrated in method 100. Additional steps can be provided before, during and after method 100, and some steps described can be replaced, eliminated, or moved around for additional embodiments of the method. Not all steps are described herein in detail for reasons of simplicity. Method 100 is described below in conjunction with FIG. 2-13, which are fragmentary cross-sectional views of the workpiece 200 at different stages of fabrication according to various embodiments of method 100. Because the workpiece 200 will be fabricated into a device structure, the workpiece 200 may be referred to herein as a device structure 200 as the context requires. For avoidance of doubts, the X, Y and Z directions in FIGS. 2-14 are perpendicular to one another. Throughout the present disclosure, unless expressly otherwise described, like reference numerals denote like features.

The device structure 200 shown in the figures of the present disclosure is simplified and not all features in the device structure 200 are illustrated or described in detail. The device structure 200 shown in the figures may be a portion of an IC chip, a system on chip (SoC), or portion thereof, that may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Figure 2:
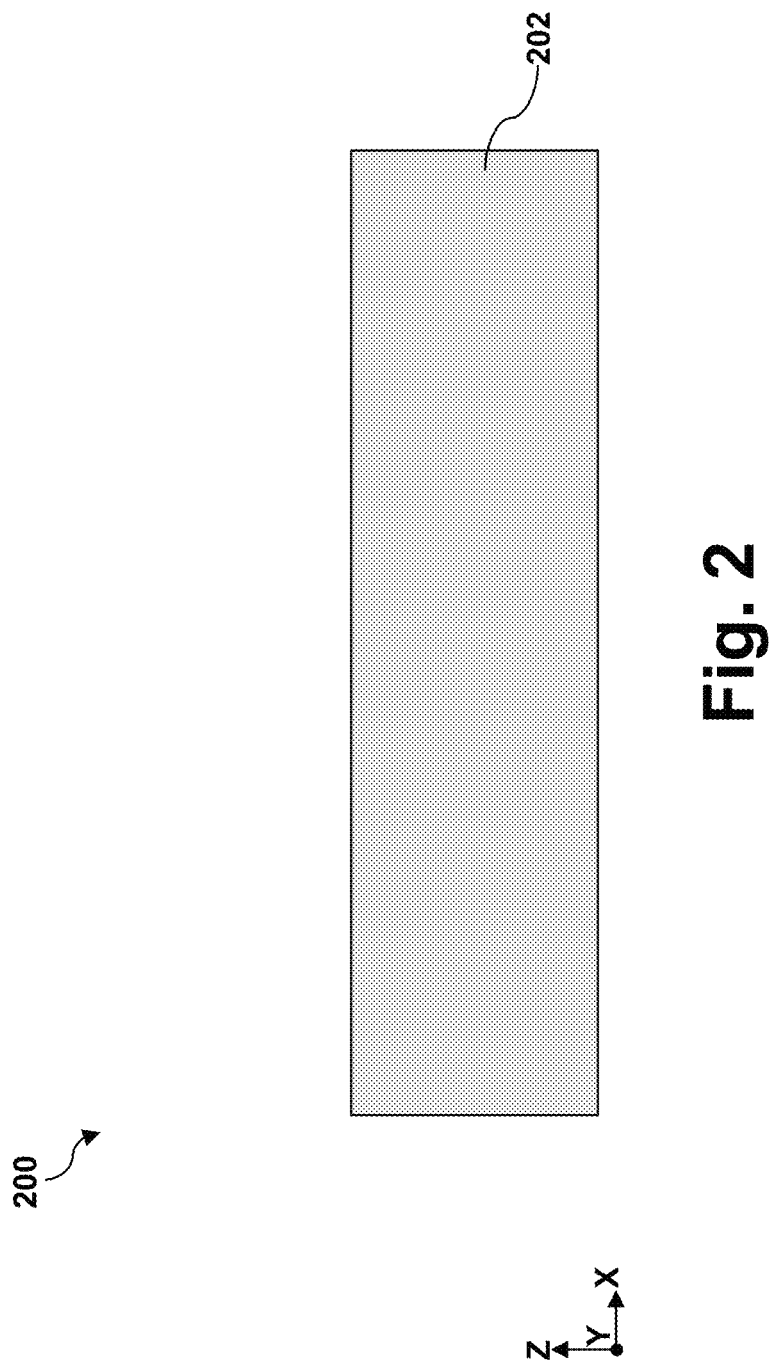
FIGS. 2-13 are fragmentary cross-sectional views of a workpiece undergoing operations of the method in FIG. 1, according to various aspects of the present disclosure.

Referring to FIGS. 1 and 2, method 100 includes a block 102 where a substrate 202 is provided. The substrate 202 is a part of a workpiece 200, which will include further structures as method 100 progresses. In an embodiment, the substrate 202 includes silicon (Si). Alternatively or additionally, substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. Substrate 202 can include various doped regions (not shown) depending on design requirements of device structure 200. In some implementations, substrate 202 includes p-type doped regions (for example, p-type wells) doped with p-type dopants, such as boron (for example, $BF_2$), indium, other p-type dopant, or combinations thereof. In some implementations, substrate 202 includes n-type doped regions (for example, n-type wells) doped with n-type dopants, such as phosphorus (P), arsenic (As), other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Figure 3:
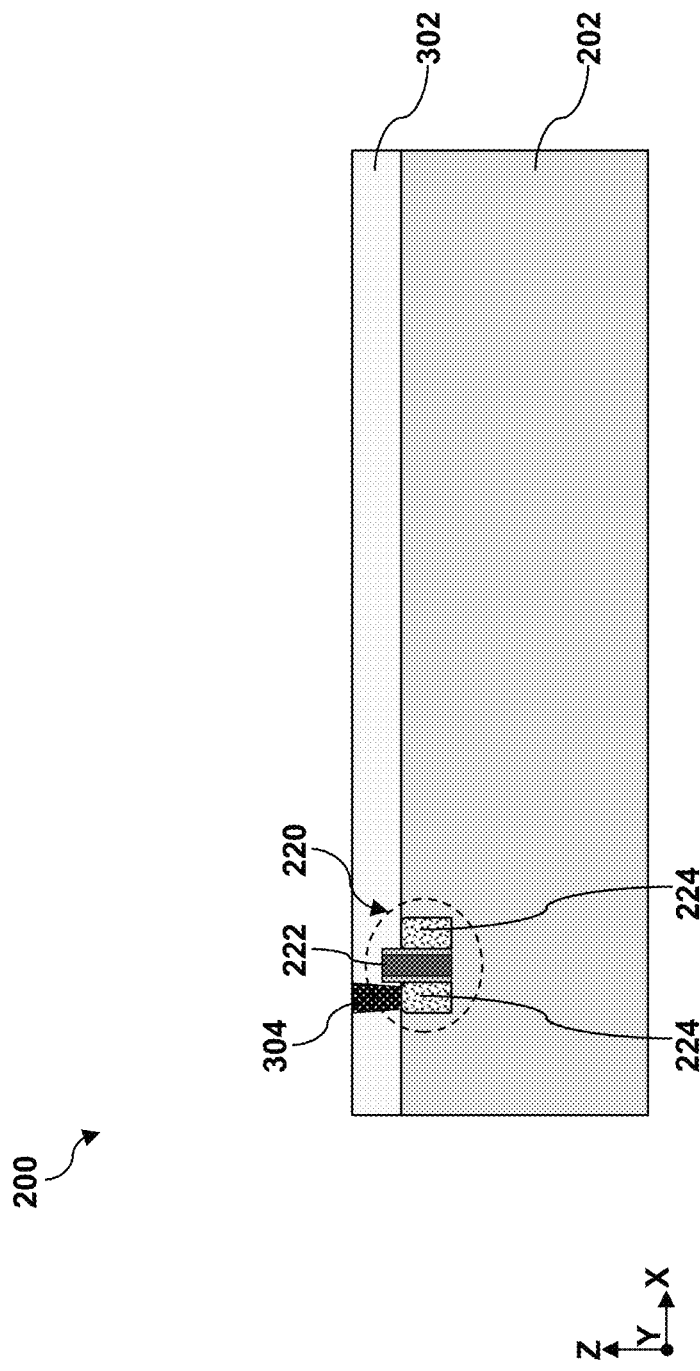

Referring to FIGS. 1 and 3, method 100 includes a block 104 where a device 220 is formed on the substrate 202. The device 220 may be a planar transistor or a multi-gate transistor, such as a fin-like FET (FinFET) or a gate-all-around (GAA) transistor. A GAA transistor may include channel regions of various shapes including nanowire, nanobar, or nanosheet, which may be collectively referred to as nanostructures. A GAA transistor may also be referred to as a multi-bridge-channel (MBC) transistor or a surrounding-gate-transistor (SGT). The device 220 representatively shown in FIG. 3 is a FinFET that includes a gate structure 222 wrapping over a channel region of a fin structure (not explicitly shown in FIG. 3) arising from the substrate 202 and source/drain features 224 disposed over source/drain regions of the fin structure. The fin structure may be formed from the substrate 202, which may be a silicon (Si) substrate, or from an epitaxial layer formed on the substrate 202. In the latter case, the epitaxial layer may include germanium (Ge) or silicon germanium (SiGe). While the device 220 is shown as a FinFET in FIG. 3 and subsequent figures, it should be understood that the device 220 may as well be a planar device or a GAA transistor.

While not explicitly shown, the gate structure 222 includes an interfacial layer interfacing the fin structure, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr) TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 222 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The source/drain features 224 may be deposited using vapor-phase epitaxy (VPE), ultra-high vacuum CVD (UHV-CVD), molecular beam epitaxy (MBE), and/or other suitable processes. When the source/drain features 224 is n-type, it may include silicon (Si) doped with an n-type dopant, such as phosphorus (P) or arsenic (As). When the source/drain features 224 is p-type, it may include silicon germanium (SiGe) doped with a p-type dopant, such as boron (B) or boron difluoride ($BF_2$). In some alternative embodiments not explicitly shown in the figures, the source/drain features 224 may include multiple layers. In one example, a source/drain features 224 may include a lightly doped first epitaxial layer over source/drain region of the fin structure, a heavily doped second epitaxial layer over the lightly doped first epitaxial layer, and a capping epitaxial layer disposed over the heavily doped second epitaxial layer. The first epitaxial layer has a lower dopant concentration or a smaller germanium content (when germanium is present) than the second epitaxial layer to reduce lattice mismatch defects. The second epitaxial layer has the highest dopant concentration or the highest germanium content (when germanium is present) to reduce resistance and increase strain on the channels. The capping epitaxial layer may have a smaller dopant concentration and germanium content (when germanium is present) than the second epitaxial layer to increase etching resistance.

Although not explicitly shown in FIG. 3, multiple fin structures are formed over the substrate 202. The fin structures may be isolated from one another by an isolation feature. In some implementations, the isolation features may be formed by etching a trench in substrate 202 or an epitaxial layer on the substrate using a dry etch process and filling the trench with insulator material using a chemical vapor deposition (CVD) process, flowable CVD (FCVD) process, or a spin-on glass process. A chemical mechanical polishing (CMP) process may be performed to remove excessive insulator material and to provide a planar surface. The insulator material is then etched back to form the isolation feature such that the fin structure rises above the isolation feature. In some implementations, the isolation features may include a multi-layer structure that includes a liner dielectric layer and bulk dielectric layer. The isolation feature may include silicon oxide, silicon oxynitride, boron silicate glass (BSG), or phosphosilicate glass (PSG).

Referring to FIGS. 1 and 3, method 100 includes a block 106 where MEOL structures are formed over the substrate 202. In the depicted embodiment, the MEOL structures may include an interlayer dielectric (ILD) layer 302 and a source/drain contact 304. As shown in FIG. 3, the source/drain contact 304 extends through the ILD layer 302 to be physically and electrically coupled to one of the source/drain features 224. In some embodiments, the ILD layer 302 may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), and/or other suitable dielectric materials. The ILD layer 302 may be deposited using PECVD, FCVD, spin-on coating, or a suitable deposition technique. In some embodiments, after formation of the ILD layer 302, the workpiece 200 may be annealed to improve integrity of the ILD layer 302. The source/drain contact 304 may include ruthenium (Ru), cobalt (Co), nickel (Ni), or copper (Cu). The source/drain contact 304 may be deposited using CVD, PVD, or a suitable method. Although not shown in figures, a contact etch stop layer (CESL) may be deposited before the ILD layer 302 is deposited such that the CESL is disposed between the ILD layer 302 and the source/drain features 224. The CESL may include silicon nitride or silicon oxynitride and may be deposited using CVD, ALD, or a suitable method. In some embodiments not explicitly shown, the source/drain contact 304 may include a barrier layer to interface the ILD layer 302. Such a barrier layer may include a metal nitride, such as titanium nitride, tantalum nitride, tungsten nitride, cobalt nitride, or nickel nitride. Additionally, in order to reduce contact resistance, a silicide feature may be disposed between the source/drain contact 304 and the source/drain feature 224. The silicide feature may include titanium silicide.

Figure 4:
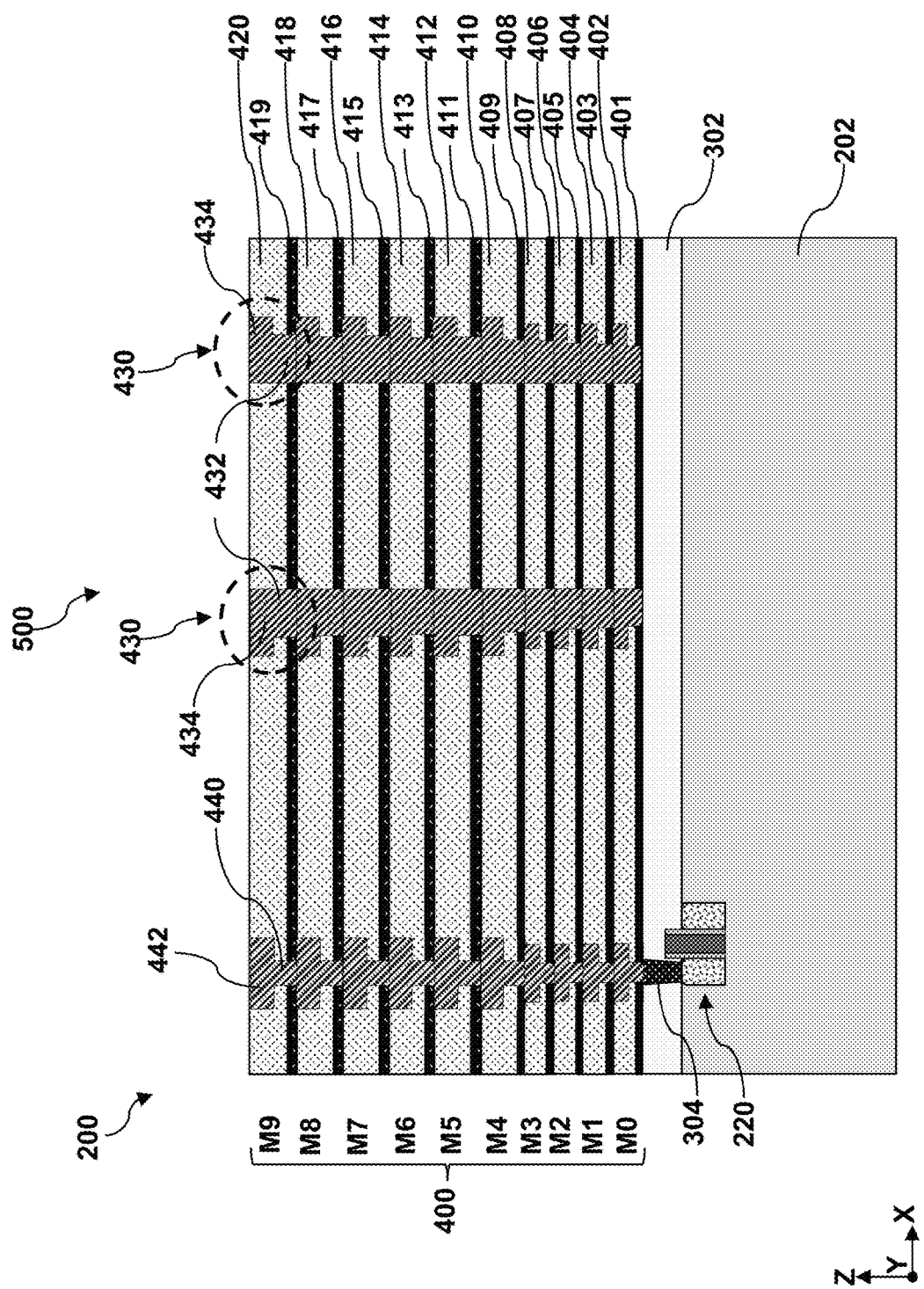

Referring to FIGS. 1 and 4, method 100 includes a block 108 where an interconnect structure 400 is formed over the substrate 202. The interconnect structure 400 may include eight (8) to thirteen (13) metal layers. In some embodiments represented in FIG. 4, the interconnect structure 400 includes ten (10) metal layers, including a first metal layer M0, a second metal layer M1, a third metal layer M2, a fourth metal layer M3, a fifth metal layer M4, a sixth metal layer M5, a seventh layer M6, an eighth metal layer M7, a ninth metal layer M8, and a tenth metal layer M9. Each of the metal layers includes an etch stop layer (ESL) and an intermetal dielectric (IMD) layer disposed on the ESL. In the depicted embodiment, the interconnect structure 400 includes ESLs 401, 403, 405, 407, 409, 411, 413, 415, 417, and 419 and IMD layers 402, 404, 406, 408, 410, 412, 414, 416, 418, and 420. It can be said that ESLs interleave the IMD layers or that IMD layers interleave the ESLs. The ESLs may share the same composition and may include silicon nitride or silicon oxynitride. The IMD layers may share the same composition and may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide.

Each of the metal layers M0-M9 includes a plurality of vertically extending vias and horizontally metal lines. By way of example, a via 440 and a metal line 442 in the tenth metal layer M9 are illustrated in FIG. 4. In the depicted embodiment, the via 440 vertical extends through a portion of the IMD layer 420 and the ESL 419 and the metal line 442 is embedded completely in the IMD layer 420. Similar vias and metal lines disposed in metal layers M0-M8 may be disposed directly below the via 440 such that the metal line 442 is electrically coupled to the source/drain contact 304. It is noted that the metal lines, including the metal line 442, may extend lengthwise along the Y direction. Besides the vias and metal lines, the interconnect structure 400 also includes a guard ring structure 500. In some embodiments represented in FIG. 4, the guard ring structure 500 includes a plurality of ring layers in the metal layers M0-M8. Each of the plurality of ring layers includes a lower portion and an upper portion disposed over the lower portion. For example, the tenth metal layer M9 includes a ring layer 430 that includes a lower portion 432 and an upper portion 434 disposed on the lower portion 432. As used herein, a ring refers to a structure that extends continuously around a space to form a closed loop. As shown in FIG. 4, the ring layer 430 is a closed loop along the X-Y plane such that a portion of the ESL 419 and the IMD layer 420 is completely surrounded by the ring layer 430. Both the lower portion 432 and the upper portion 434, as part of the ring layer 430, are also rings that form closed loops along the X-Y plane. Each of the ring layers shares substantially the same shape from a top view along the Z direction. For example, the ring layers may be circular, rectangular, square, hexagonal, octagonal, or other polygonal shape from a top view.

As shown in FIG. 4, the plurality of ring layers in the metal layers M0-M9 are vertically aligned to form the guard ring structure 500. In other words, because the ring layers are stacked vertically, the guard ring structure 500 may be a cylinder or a prism with an axis along the Z direction. When each of the rings is circular in shape, the guard ring structure 500 resembles a cylinder. When each of the rings is square or rectangular, the guard ring structure 500 resembles a rectangular prism. When each of the rings is hexagonal, the guard ring structure 500 resembles a hexagonal prism. When each of the rings is octagonal, the guard ring structure 500 resembles an octagonal prism. The guard ring structure 500 encloses a portion of the ESLs and IMD layers such that the portion of the ESLs and IMD layers in the guard ring structure 500 is isolated from the rest of the ESLs and IMD layers in the interconnect structure 400 by the guard ring structure 500.

In some embodiments represented in FIG. 4, inner surfaces of the plurality of ring layers in the metal layers M0-M9 are vertically aligned such that the guard ring structure 500 has a smooth inner wall. This arrangement is not trivial. It is observed that any protrusions or recesses in the inner wall of the guard ring structure 500 may enhance the stress acting on the guard ring structure 500 or the structures adjacent and outside the guard ring structure 500. Mechanically speaking, it may be ideal to have a guard ring structure 500 with uniform radial thickness through its height along the Z direction. However, because metal lines in lower metal layers are much narrower than the metal lines in upper metal layers, an upper portion of a uniform radial thickness may be too wide compared to other metal lines in the first 5 metal layers (M0-M4), which may lead to etch or planarization (i.e., CMP) loading effect. To prevent unbalanced etching or planarization, the upper portion of each ring layer in each metal layer has a radial thickness that is similar to a width of the metal line in the same metal layer. As a result, the ring layers in the lower metal layers (such M0-M4) may have a radial thickness smaller than that of the ring layers in the upper metal layer (such as M5-M9). This decreasing radial thickness of the guard ring structure 500 toward the substrate 202 is representative shown in FIG. 4. It follows that the guard ring structure 500 may have a maximum radial thickness on its top surface away from the substrate 202 and a minimum radial thickness on its bottom surface adjacent the substrate 202.

At block 108, the interconnect structure 400 may be formed layer by layer. Formation of each of the metal layers M0-M9 includes deposition of an ESL, deposition of an IMD layer, patterning/etching of the IMD layer and the ESL to form via and line openings, filling of the via and line openings in a single damascene or a dual damascene process, and planarizing the workpiece to remove excess materials. After the planarization, the same process steps may be repeated to form another metal layer until the set number of metal layers is reached.

Formation of the tenth metal layer M9 is provided as an example. Before the formation of the tenth metal layer M9, structures (including portions of the guard ring structure 500) in the first nine metal layers M0-M8 have already been formed. To form the tenth metal layer M9, the ESL 419 is first deposited using ALD, CVD, or a suitable deposition method. Then the IMD layer 420 is deposited on the ESL 419 using CVD, FCVD, spin-on coating, or a suitable deposition method. The IMD layer 420 and the ESL 419 are then patterned to form openings for the via 440, the metal line 442, the lower portion 432, and the upper portion 434, using a combination of photolithography processes and etching processes. For example, at least one hard mask layer is deposited over the IMD layer 420 using CVD or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the IMD layer 420 and the ESL 419. The etching of the IMD layer 420 and the ESL 419 may include a dry etch process, a wet etch process, or a combination thereof. In some instances, different etch processes or different etchant chemistries may be used to etch the IMD layer 420 and the ESL 419. After the IMD layer 420 and the ESL 419 are patterned, the residual patterned photoresist may be removed by ashing, stripping, or selective etching.

After the openings are formed in the IMD layer 420 and the ESL 419, the via 440, the metal line 442, the lower portion 432, and the upper portion 434 are formed using single damascene or dual damascene processes. In the depicted embodiment, the via 440, the metal line 442, the lower portion 432, and the upper portion 434 are formed using dual damascene process. That is, the openings for the via 440 and the metal line 442 are filled with a conductive material at the same time. Similarly, the opening for the lower portion 432 and the upper portion 434 are filled at the same time. In some embodiments, the top surface of the via 440 may be substantially coplanar with the top surface of the lower portion 432 as their corresponding openings are formed at the same etching step. In embodiments where single damascene processes are adopted, at least one additional etch stop layer may be needed at a level substantially coplanar with the top surfaces of the via 440 and the lower portion 432. This additional etch stop layer may share a similar composition with the ESLs, such as the ESL 419. When single damascene processes are adopted, the via 440 and the metal line 442 are filled in separate steps as the opening for the metal line 442 may be formed after the via 440 is formed. Similarly, when single damascene processes are adopted, the lower portion 432 and upper portion 434 are filled in separate steps as the opening for the upper portion 434 may be formed after the lower portion 432 is formed.

Vias, metal lines, and ring layers in the interconnect structure 400 may include titanium (Ti), ruthenium (Ru), nickel (Ni), cobalt (Co), copper (Cu), molybdenum (Mo), tungsten (W), aluminum (Al), and/or other suitable materials. In one embodiment, they may include copper (Cu). In some embodiments, in order to prevent electromigration from the metal material or oxygen diffusion from the dielectric features into the metal material, vias, metal lines, and ring layers may each include a barrier layer to interface the ESLs and IMD layers. The barrier layer may include titanium nitride (TiN), tantalum nitride (TaN), or cobalt nitride (CON). In an example process to fill the lower portion 432 and the upper portion 434, a barrier layer is first deposited over the openings for the lower portion 432 and the upper portion 434 using ALD, PVD, CVD, metal organic CVD (MOCVD), or a suitable method. A seed layer is then deposited over the barrier layer using ALD, PVD, CVD, MOCVD, or a suitable method. In some instances, the seed layer may include titanium or copper. Then a bulk metal layer may be deposited on the seed layer using electroplating or electroless plating. In one embodiment, the bulk metal layer may include copper. In some alternative embodiments, the seed layer may be omitted and the openings are filled with titanium (Ti), ruthenium (Ru), nickel (Ni), cobalt (Co), copper (Cu), molybdenum (Mo), tungsten (W), aluminum (Al) using PVD, CVD, MOCVD, or a suitable method. After the filling with the barrier layer, the seed layer, and the bulk metal layer, the workpiece 200 is planarized using, for example CMP, to form the via 440, the metal line 442, the lower portion 432, and the upper portion 434.

Although the substrate 202 is shown in FIG. 4 and subsequent figures as having a thickness smaller than that of the interconnect structure 400, the substrate 202 is in fact much thicker than the interconnect structure 400 and is shown with a much smaller thickness for illustration purposes. Because the substrate 202 is much thicker than the interconnect structure 400, showing the substrate 202 in scale would result in unclear illustration of the details in the interconnect structure 400. For these reasons, at least the substrate 202 is not shown in scale in the figures of the present disclosure.

Figure 5:
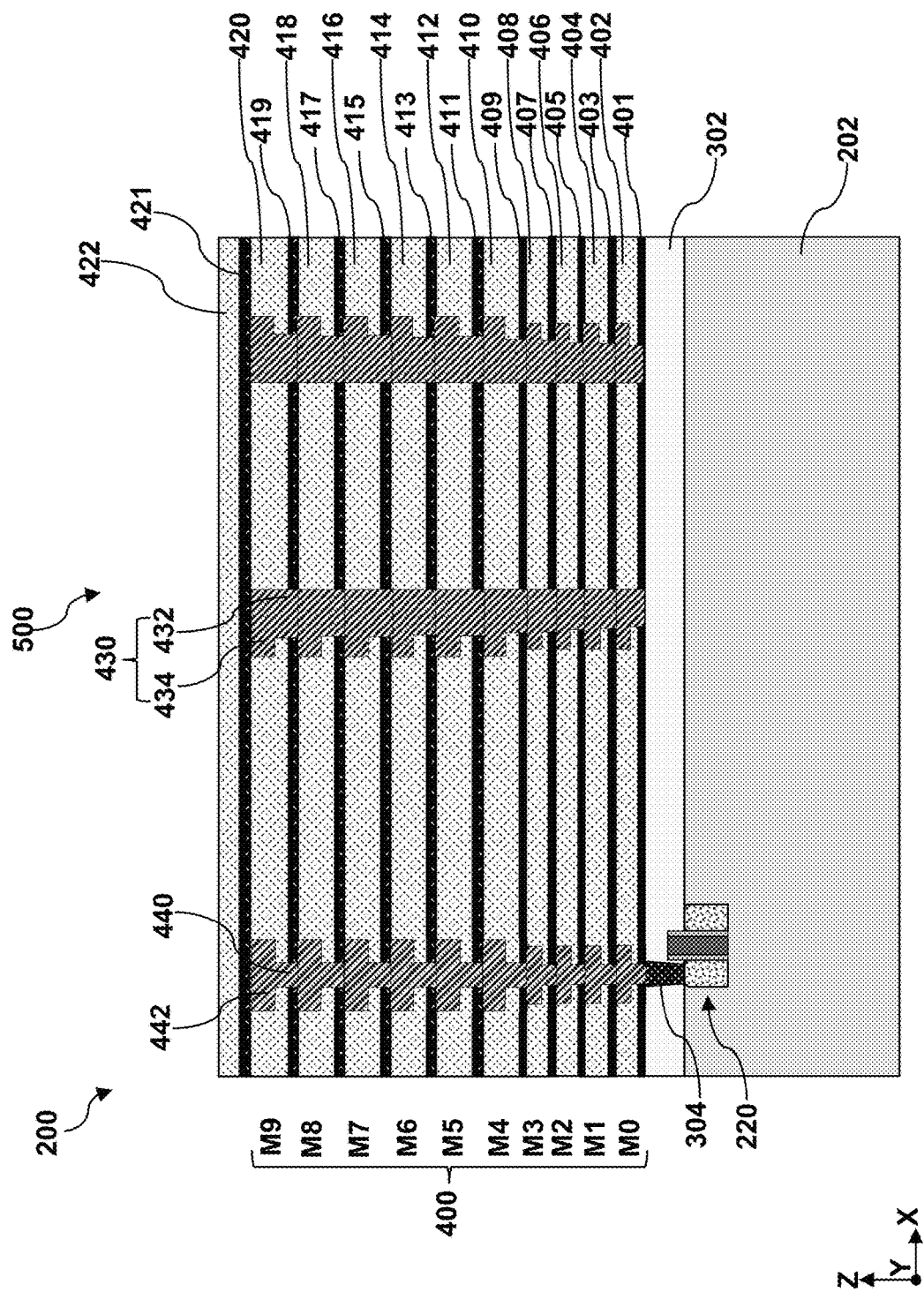
Figure 6:
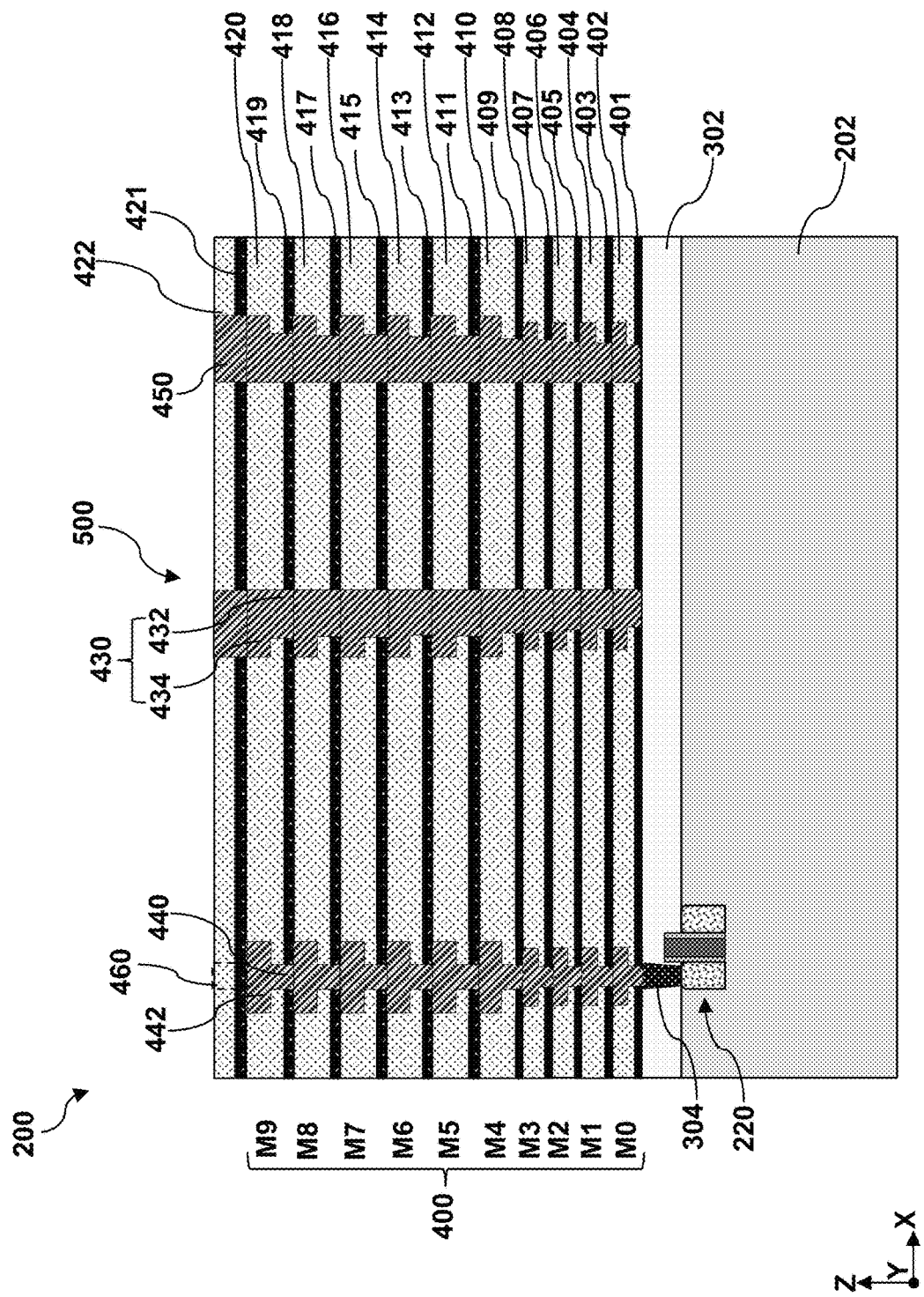

Referring to FIGS. 1, 5 and 6, method 100 includes a block 110 where a coupling feature 450 is formed over the guard ring structure 500. Operations at block 110 include deposition of an additional etch stop layer (ESL) 421 and an additional IMD layer 422 over the workpiece 200 (shown in FIG. 5) and formation of the coupling feature 450 in the additional ESL 421 and the additional IMD layer 422 (shown in FIG. 6). Referring first to FIG. 5, the additional ESL 421 may be deposited directly on top surfaces of the guard ring structure 500, the IMD layer 420, and the metal line 442. In some embodiments, the additional ESL 421 may be similar to the ESLs 401, 403, 405, 407, 409, 411, 413, 415, 417, and 419 in terms of compositions and formation processes. The additional IMD layer 422 is then deposited on the additional ESL 421. In some embodiments, the additional IMD layer 422 may be similar to the IMD layers 402, 404, 406, 408, 410, 412, 414, 416, 418, and 420 in terms of composition and formation processes. In the depicted embodiments, a thickness of the additional IMD layer 422 may be smaller than a thickness of the IMD layer 420 because the coupling feature 450 to be formed in the additional IMD layer 422 is a single level structure that does not include both a via and a metal line. In some instances, the thickness of the additional IMD layer 422 may be about one half (½) of the IMD layer 420.

Referring then to FIG. 6, after the additional ESL 421 and the additional IMD layer 422 are deposited over the guard ring structure 500, the coupling feature 450 is formed in the additional ESL 421 and the additional IMD layer 422 to physically and electrically couple to the top surface of the guard ring structure 500. According to the present disclosure, the coupling feature 450 functions to electrically couple the guard ring structure 500 and the to-be-formed via structure to eliminate any stray or parasitic capacitance. That is, the coupling feature 450 of the present disclosure may only need to provide vertical connection. For that reason, the coupling feature 450 does not need to have a lower via portion and an upper metal line portion and may only need a single level, which may resemble either a via or a metal line in some embodiments. In the depicted embodiment, the coupling feature 450 has a ring shape, just like the ring layers in the interconnect structure 400. Additionally, in the depicted embodiment, the coupling feature 450 includes a radial thickness identical to that of the upper portion 434. It is noted that the inner edge of the coupling feature 450 is vertically aligned with the inner sidewall of the guard ring structure 500 to avoid protrusions that may enhance the stress generated by the to-be-formed via structure. As described above, the coupling feature 450 may be formed using a single damascene process and may include titanium (Ti), ruthenium (Ru), nickel (Ni), cobalt (Co), copper (Cu), molybdenum (Mo), tungsten (W), aluminum (Al), and/or other suitable materials. In one embodiment, the coupling feature 450 may include copper (Cu). In some implementations represented in FIG. 6, a top via 460 may be formed along with the coupling feature 450 to vertically route the signals from the metal line 442 upward. The top via 460 and the coupling feature 450 naturally share the same composition. It is noted that the top via 460 is shown in dotted lines because the top via 460 is out of the plane (i.e., the X-Z plane) in the fragmentary cross-sectional view shown in FIG. 6. Like the coupling feature 450, the top via 460 extends completely through the additional ESL 421 and the additional IMD layer 422 to physically and electrically couple to the top surface of the metal line 442.

In some alternative not shown in the figures, the coupling feature 450 may be a via or a metal line segment that does not form a ring shape. Such a coupling feature 450 may function just as well because it nevertheless electrically couples the guard ring structure 500 and the to-be-formed via structure. The coupling feature 450 may be viewed as one of the ring layers and therefore a portion of the guard ring structure 500.

Figure 7:
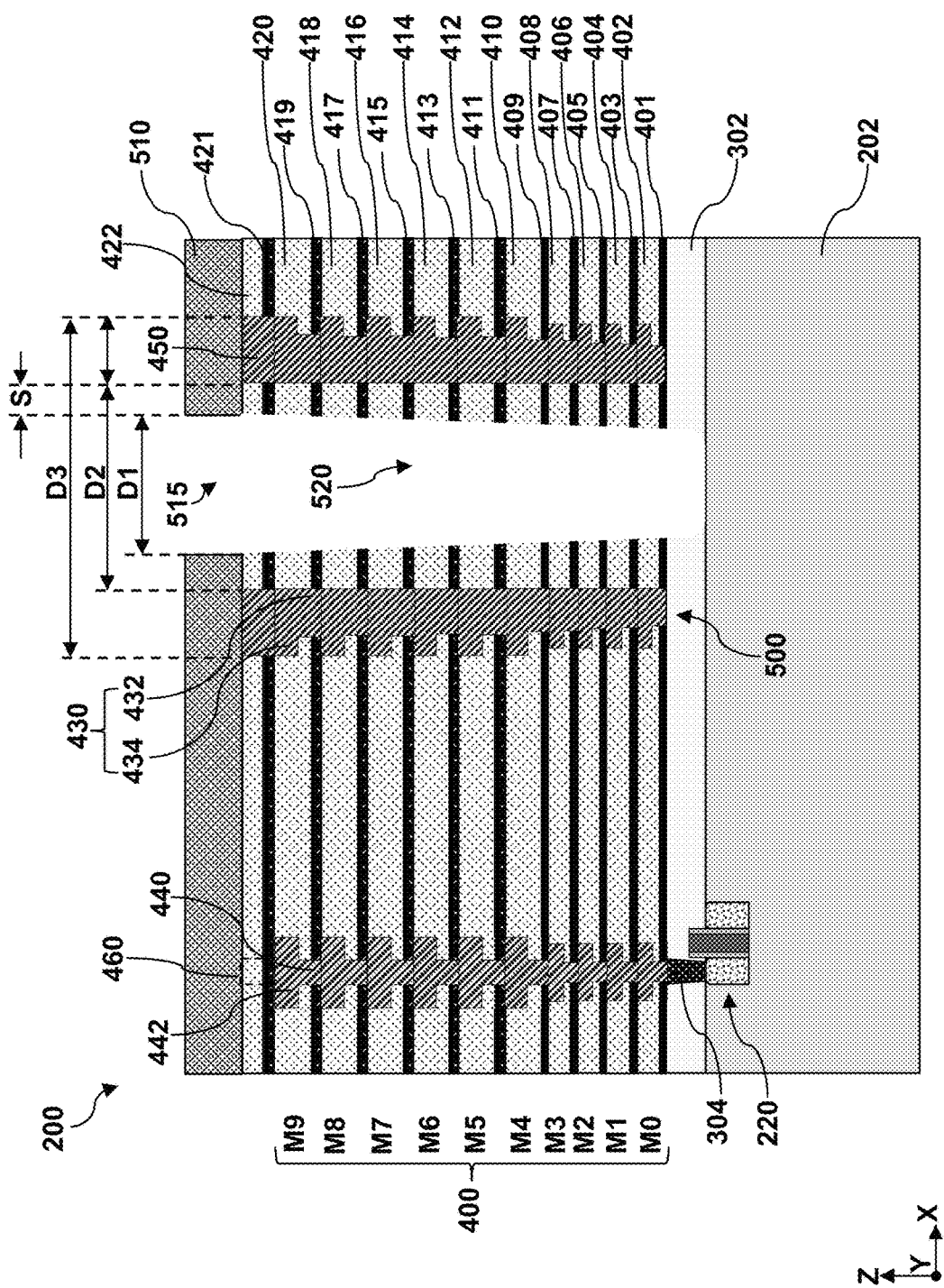

Referring to FIGS. 1 and 7, method 100 includes a block 112 where a first opening 520 is formed through the guard ring structure 500. To form the first opening 520, a masking layer 510 is formed over the interconnect structure 400. The masking layer 510 may include photoresist, silicon oxide, silicon nitride, silicon carbide, aluminum oxide, or titanium nitride. In one embodiment, the masking layer 510 may be a photoresist layer having a thickness between about 5 μm and about 15 μm. The photoresist layer has a composition different from the ESLs and IMD layers that allows selectively etching the ESLs and the IMD layers. In this embodiment, the masking layer 510 may be deposited using spin-on coating or FCVD. The deposited masking layer 510 then undergoes an pre-exposure baking process, exposure to radiation reflected from or transmitted through a photomask, a post-exposure baking process, and developing process, so as to form a patterned masking layer 510. The patterned masking layer 510 has a mask opening 515. The patterned masking layer 510 is then applied as an etch mask to etch the ESLs and IMD layers within the inner surface of the guard ring structure 500. The etch process here may be a dry etch process (e.g., a reactive ion etching (RIE) process). In some instances, an example dry etch process may implement an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. The etching at block 112 terminates when the first opening 520 reaches a top surface of the substrate 202. That is, the first opening 520 may extend through all the IMD layers, ESLs, and the ILD layer 302 in some embodiments. The termination of the etching at block 112 may be controlled by time or by an etch rate change when the etching reaches the substrate 202. In some implementations, the etch chemistry at block 112 is selected such that the etch process at block 112 etches the substrate 202 at a slower rate. In some embodiments represented in FIG. 7, the first opening 520 tapers downward.

In some embodiments represented in FIG. 7, the mask opening 515, the first opening 520, and the guard ring structure 500 are substantially circular when viewed along the Z direction. In these embodiments, the mask opening 515 has a first diameter D1, an inner edge of the guard ring structure 500 has a second diameter D2, and the outer edge of the guard ring structure 500 has a third diameter D3. As shown in FIG. 7, the third diameter D3 is greater than the second diameter D2 and the second diameter D2 is greater than the first diameter D1. In some embodiments, the first diameter D1 may be between about 2 μm and about 5 μm. While the first diameter D1 is largely determined by the design requirement, several factors have to be considered. First, while a larger first diameter D1 may reduce contact resistance, a larger first diameter D1 requires greater second and third diameters D2 and D3 for accommodation, which can take additional space or requires layout changes. Second, a smaller first diameter D1 can result in an aspect ratio (i.e., the vertical depth of the first opening 520/the first diameter D1) that is greater than 10. Such a high aspect ratio can lead to challenges in the etching processes and the subsequent metal fill process. The difference between the second diameter D2 and the first diameter D1 determines a spacing S, which refers to a radial thickness of the residual ESLs and IMD layers within the guard ring structure 500 and not removed during the formation of the first opening 520. In some implementations, the spacing S is between about 0.2 μm and about 0.5 μm. This range is not trivial. When the spacing S is below 0.2 μm, the residual ESLs and IMD layers may not have sufficient thickness to absorb the stress generated by the to-be-formed via structure. Additionally, when the spacing S is below 0.2 μm, the spacing S may not provide sufficient tolerance when the mask opening 515 is misaligned or off centered. For example, when the spacing S is about 0.1 μm and the mask opening 515 is misaligned, the etching of the first opening 520 may completely remove the residual ESLs and IMD layers for one side of the guard ring structure 500 and damage the guard ring structure 500. That may cause direct metal-to-metal contact between the inner edge of the guard ring structure 500 and the via structure, which may lead to concentration of stress or delamination. When the spacing S is greater than 0.5 μm, the guard ring structure 500 may take up too much real estate, which may be wasteful. The second diameter D2 may be substantially equal to summation of two times of the spacing S and the first diameter D1 (i.e., 2S+D1=D2). The second diameter D2 may be between about 2.4 μm and about 6 μm.

The difference between the third diameter D3 and the second diameter D2 is determined by a radial thickness T of the topmost surface of the guard ring structure 500. As shown in FIG. 7, the radial thickness of the topmost surface of the guard ring structure may just be the radial thickness T of the upper portion 434 in the tenth metal layer M9. In the depicted embodiment, the coupling feature 450 also has the radial thickness T. In some embodiments, the radial thickness T may be between about 100 nm and about 300 nm. This thickness range is not trivial. When the radial thickness T is smaller than 100 nm, the guard ring structure 500 does not have the structural strength or integrity to isolate the stress generated by the via structure within the guard ring structure 500. When the radial thickness T is greater than 300 nm, it would be an overkill and the thick guard ring structure 500 may take too much space. The third diameter D3 may be substantially equal to summation of two times of the radial thickness T and the second diameter D2 (i.e., 2T+D2=D3). The third diameter D3 may be between about 2.6 μm and about 6.6 μm.

Figure 8:
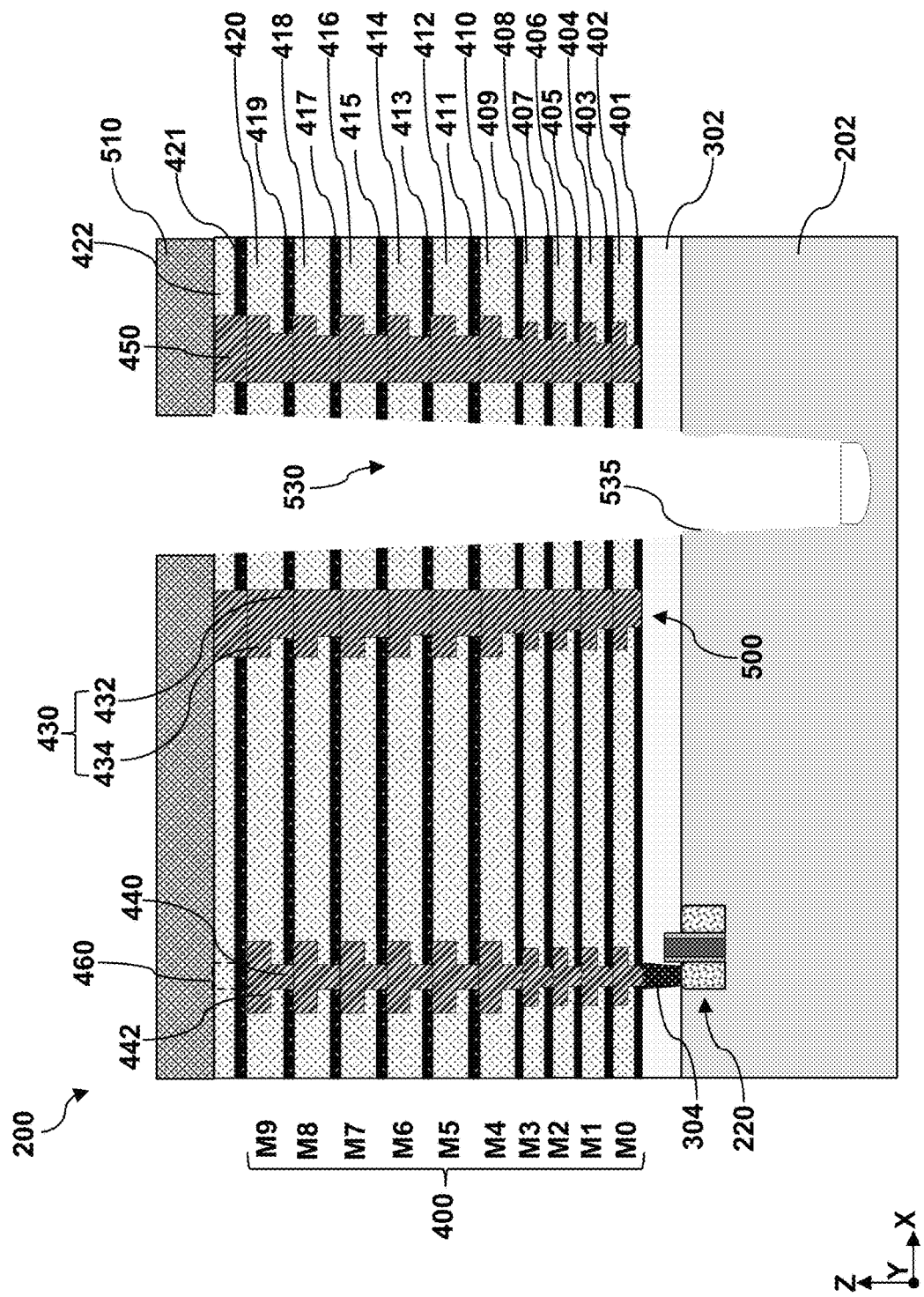

Referring to FIGS. 1 and 8, method 100 includes a block 114 where the first opening 520 is extended into the substrate 202 to form a second opening 530. At block 114, an etch process different from the one at block 112 is used to extend the first opening 520 through the substrate 202. In some embodiments, a cyclic etch process may be used at block 114. The cyclic etch process may include multiple etch cycles and multiple deposition cycles. In some instances, each of the etch cycles is followed immediately by a deposition cycle. In one example, each of the etch cycles includes use of a fluorine-containing etchant, such as sulfur hexafluoride ($SF_6$) or nitrogen trifluoride ($NF_3$), which etches the substrate 202. Each of the deposition cycles includes use of a fluorocarbon species, such as hexafluoroethane ($C_2F_6$) or octafluorocyclobutane ($C_4F_8$), which may form a silicon-carbon polymer along freshly etched sidewalls. As the polymer passivates the sidewalls of the opening, lateral etching is reduced, thereby allowing high-aspect-ratio and directional etching into the substrate 202. This cyclic etch process may also be referred to as Bosch process. Once the first opening 520 is extended into the substrate 202 by a depth between about 10 μm and about 15 μm, the second opening 530 shown in FIG. 8 is formed. The cyclic etch process may result in scalloped sidewall profiles. In some embodiments illustrated in FIG. 8, the cyclic etch process at block 114 may leave behind a circular ridge 535. In some other embodiments not explicitly illustrated in the figures, the cyclic etch process may leave behind several circular ridges similar to the circular ridge 535 shown in FIG. 8.

Figure 9:
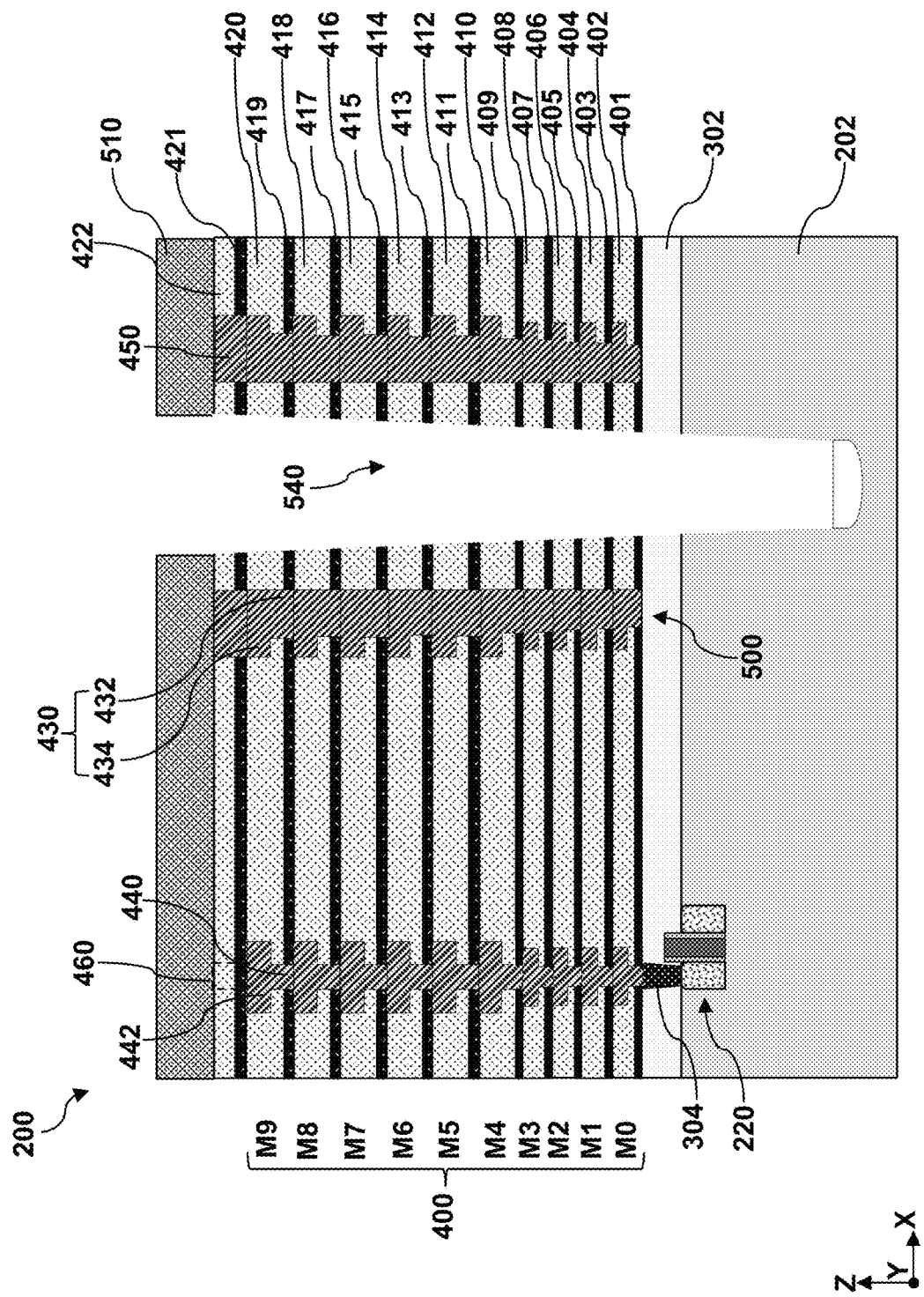

Referring to FIGS. 1 and 9, method 100 includes a block 116 where an etch process is performed to smooth sidewalls of the second opening 530 to form a third opening 540. As described above, the cyclic etch process at block 114 may result in a scalloped sidewall surface of the second opening 530. The scalloped surface profile may hinder satisfactory formation of a via structure in the second opening 530. For example, the outward protruding circular ridges, such as the circular ridge 535, may hinder the line of sight of the deposition of materials for the via structure and result in voids. Such voids may increase the resistance of the via structure and reduce the device performance. Operations at block 116 aim to smooth out the surface of the second opening 530 to facilitate satisfactory formation of the via structure. At block 116, a dry etch or a suitable etch process may be performed to remove the circular ridges resulted from the cyclic etching at block 114. Because the scalloped surface may be largely disposed on surface of the second opening 530 in the substrate 202, the etch process at block 116 may be selected to be selective to the semiconductor material of the substrate 202, such as silicon (Si). An example dry etch process at block 116 may include use of chlorine ($Cl_2$), sulfur hexafluoride ($SF_6$), nitrogen trifluoride ($NF_3$), or a combination thereof. In at least some embodiment, the etch process at block 116 does not use carbon-containing species to reduce generation of polymers on sidewalls of the third opening 540. After the etch process at block 116 smooths out surface of the second opening 530, the third opening 540 is formed.

Figure 10:
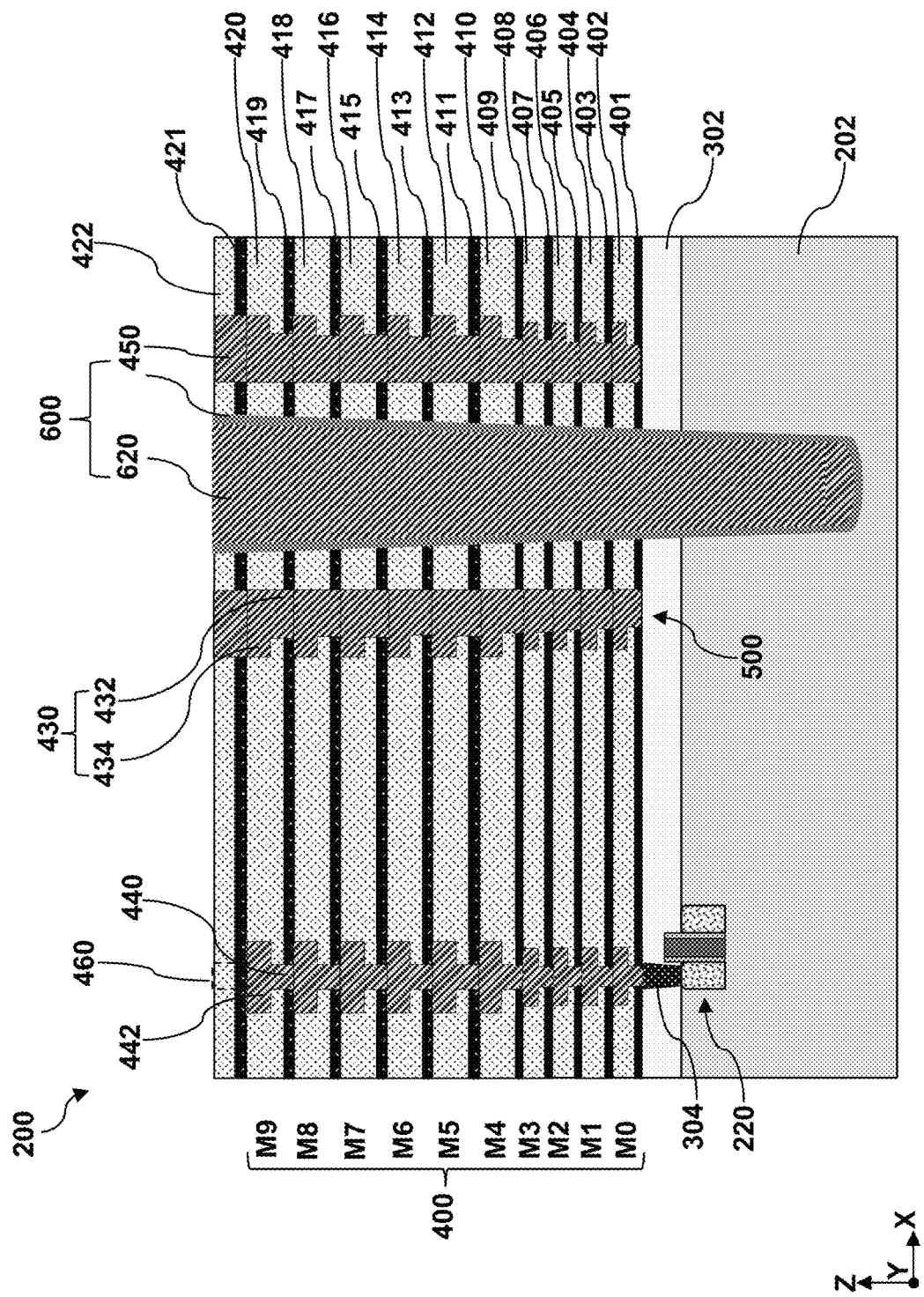

Referring to FIGS. 1 and 10, method 100 includes a block 118 where a via structure 600 is formed in the third opening 540. In some embodiments, the via structure 600 may include a barrier layer 610 and a metal fill layer 620. As shown in FIG. 10, the barrier layer 610 spaces the metal fill layer 620 apart from the ESLs and IMD layers within the guard ring structure 500. In some implementations, the barrier layer 610 may include tantalum nitride (TaN), titanium nitride (TiN), tungsten nitride (WN), aluminum nitride (AlN), or combinations thereof. The metal fill layer 620 may include copper (Cu), aluminum (Al), cobalt (Co), copper alloy, tantalum (Ta), titanium (Ti), or tungsten (W). In one embodiment, the barrier layer 610 includes titanium nitride (TiN) and the metal fill layer 620 includes copper (Cu). To form the via structure 600, the barrier layer 610 is first deposited using PVD, CVD, MOCVD, ALD, or a combination thereof. Then the metal fill layer 620 is deposited using electroplating, PVD, CVD, electroless plating, or a suitable method. In one embodiment, the metal fill layer 620 is formed using electroplating. In this embodiment, after the formation of the barrier layer 610, a seed layer may be deposited, using PVD or a suitable process, over the workpiece 200, including over surfaces of the barrier layer 610. Then the metal fill layer 620 may be deposited over the seed layer using electroplating. In the embodiment where electroplating is used, the seed layer may include copper (Cu), titanium (Ti), or a combination thereof and the metal fill layer may include copper (Cu). The seed layer may be considered part of the metal fill layer 620. After both the barrier layer 610 and the metal fill layer 620 are deposited over the workpiece 200 and into the third opening 540, a planarization process, such as a CMP, may be performed to remove any residual masking layer 510 and any excess material over the top IMD layer 420. As shown in FIG. 10, after the planarization process, top surfaces of the coupling feature 450 and the via structure 600 are exposed and coplanar.

Figure 11:
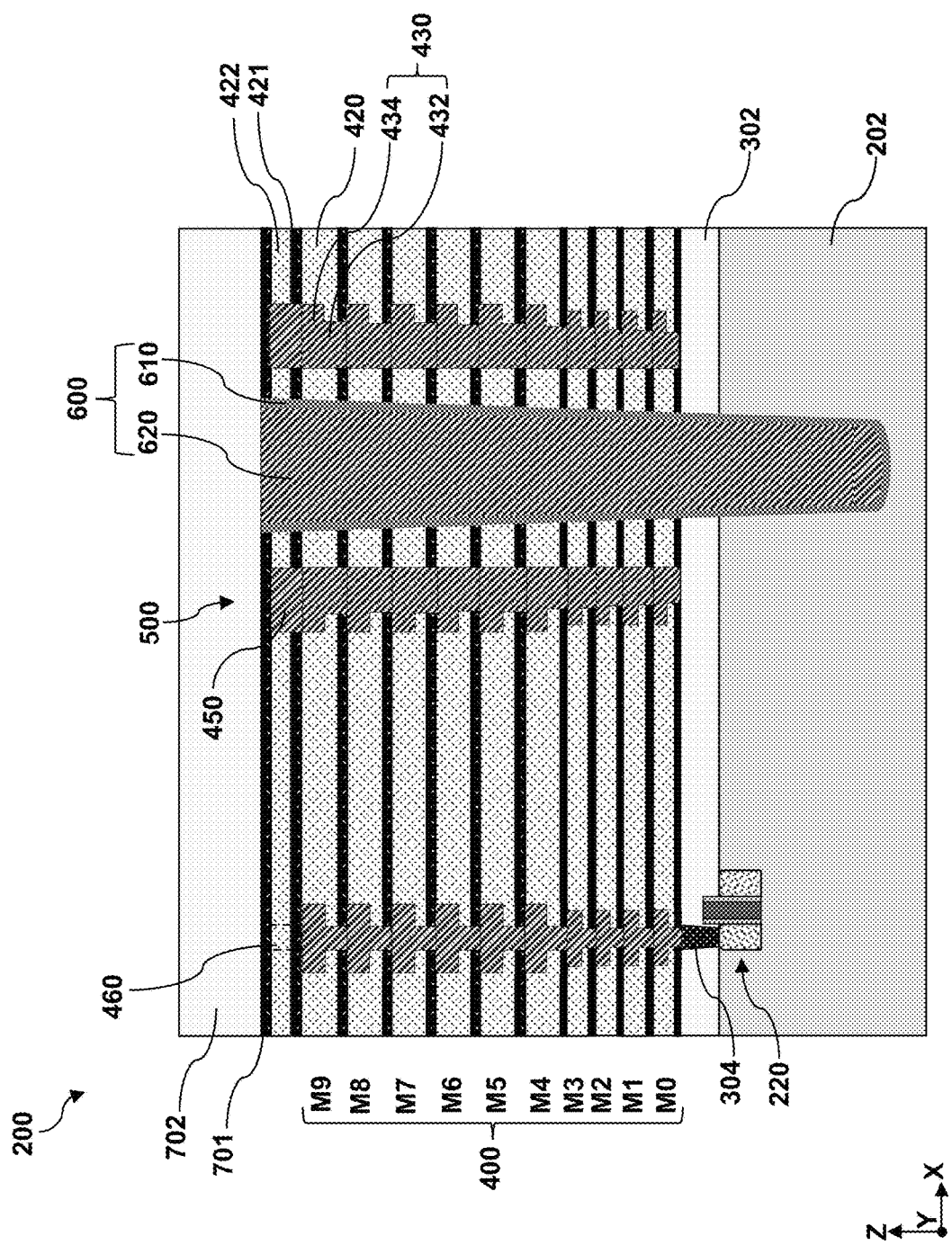

Referring to FIGS. 1 and 11, method 100 includes a block 120 where a top dielectric layer 702 is deposited over the via structure 600 and the guard ring structure 500. In some embodiments, the top dielectric layer 702 may be substantially similar to the ILD layer 302 or the IMD layer 420 (or any of the IMD layers in the interconnect structure 400) in terms of compositions and formation processes. In the depicted embodiments, the top dielectric layer 702 may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. In some embodiments represented in FIG. 11, a top ESL 701 may be formed over the top surface of the workpiece 200 before the deposition of the top dielectric layer 702. The top ESL 701 may include silicon nitride or silicon oxynitride. In these embodiments, the top ESL 701 may be deposited using CVD or a suitable deposition method and the top dielectric layer 702 may be deposited using spin-on coating, FCVD, CVD, or a suitable deposition method.

Figure 12:
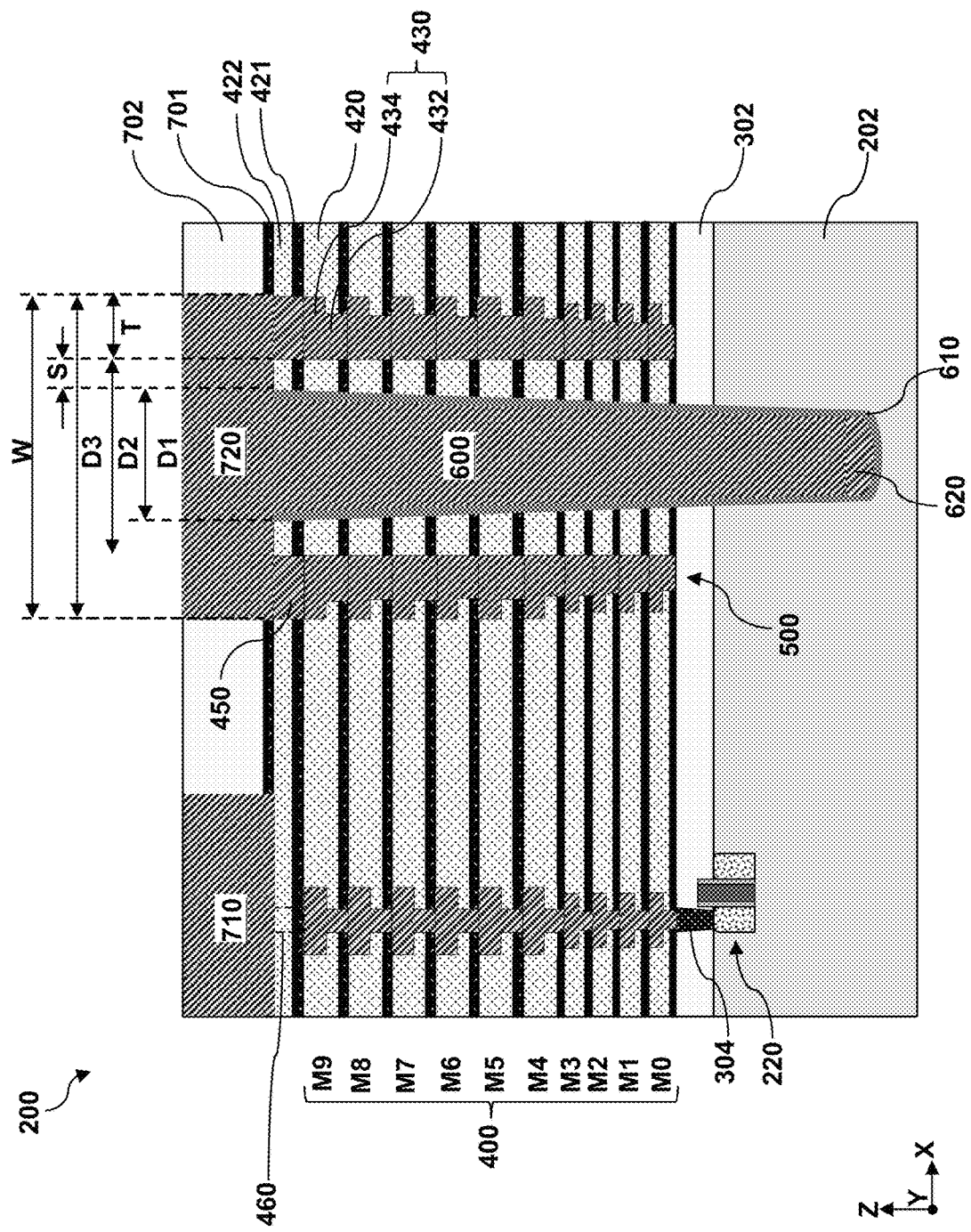

Referring to FIGS. 1 and 12, method 100 includes a block 122 where a top metal feature 720 is formed over the via structure 600 and the guard ring structure 500. As shown in FIG. 12, the top metal feature 720 is formed in the top ESL 701 and the top dielectric layer 702. To form the top metal feature 720, a top metal opening may be formed in the top dielectric layer 702 and the top ESL 701 using a combination of photolithography processes and etching processes. For example, at least one hard mask layer is deposited over the top dielectric layer 702 using CVD or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the top dielectric layer 702 and the top ESL 701. In some alternative embodiment, a patterned photoresist layer is applied as an etch mask to etch the top dielectric layer 702 and the top ESL 701. The etching of the top dielectric layer 702 and the top ESL 701 may include a dry etch process, a wet etch process, or a combination thereof. In some instances, different etch processes or different etchant chemistries may be used to etch the top dielectric layer 702 and the top ESL 701. After the top dielectric layer 702 and the top ESL 701 are patterned to form the top metal opening, the residual patterned photoresist may be removed by ashing, stripping, or selective etching. After the top metal opening is formed in the top dielectric layer 702 and the top ESL 701, a metal material is deposited over the workpiece 200, including over the top metal opening. The metal material may include copper (Cu), cobalt (Co), nickel (Ni), aluminum (Al), or a metal alloy, such as aluminum-copper alloy (Al—Cu). After the deposition of the metal material, the workpiece 200 is planarized using, for example, a CMP process to remove excess materials and provide a planar top surface for the workpiece 200. After the planarization, the top metal feature 720 is formed. As shown in FIG. 12, the top metal feature 720 spans over and is in contact with top surfaces of the coupling feature 450 and the via structure 600. FIG. 12 also shows another top metal feature 710 that is electrically coupled to the source/drain contact 304 through the vias and metal lines disposed between the another top metal feature 710 and the source/drain contact 304.

As shown in FIG. 12, the top metal feature 720 extends completely through the top dielectric layer 702 and the top ESL 701 to physically and electrically couple to the top surface of the via structure 600, including top surfaces of the barrier layer 610 and the metal fill layer 620. According to the present disclosure, the top metal feature 720 has an X-direction dimension and a Y-direction dimension such that it also physically contacts the top surface of the coupling feature 450. Put differently, a bottom surface of the top metal feature 720 is in direct contact with a top surface of the coupling feature 450. It can be seen that the top metal feature 720 and the coupling feature 450 operate together to electrically couple the via structure 600 and the guard ring structure 500. When viewed along the Y direction, the top metal feature 720 includes a width W along the X direction. The width W of the top metal feature 720 is selected to cover at least a portion of the coupling feature 450 and the via structure 600. In the embodiments represented in FIG. 12, the width W of the top metal feature 720 is substantially equal to the third diameter D3 such that sidewalls of the top metal feature 720 vertically align with sidewalls of the guard ring structure 500 along the X direction. In alternative embodiments, the width W may be greater than or smaller than the third diameter D3. As described above, the third diameter D3 may be between about 2.6 µm and about 6.6 µm.

Figure 13:
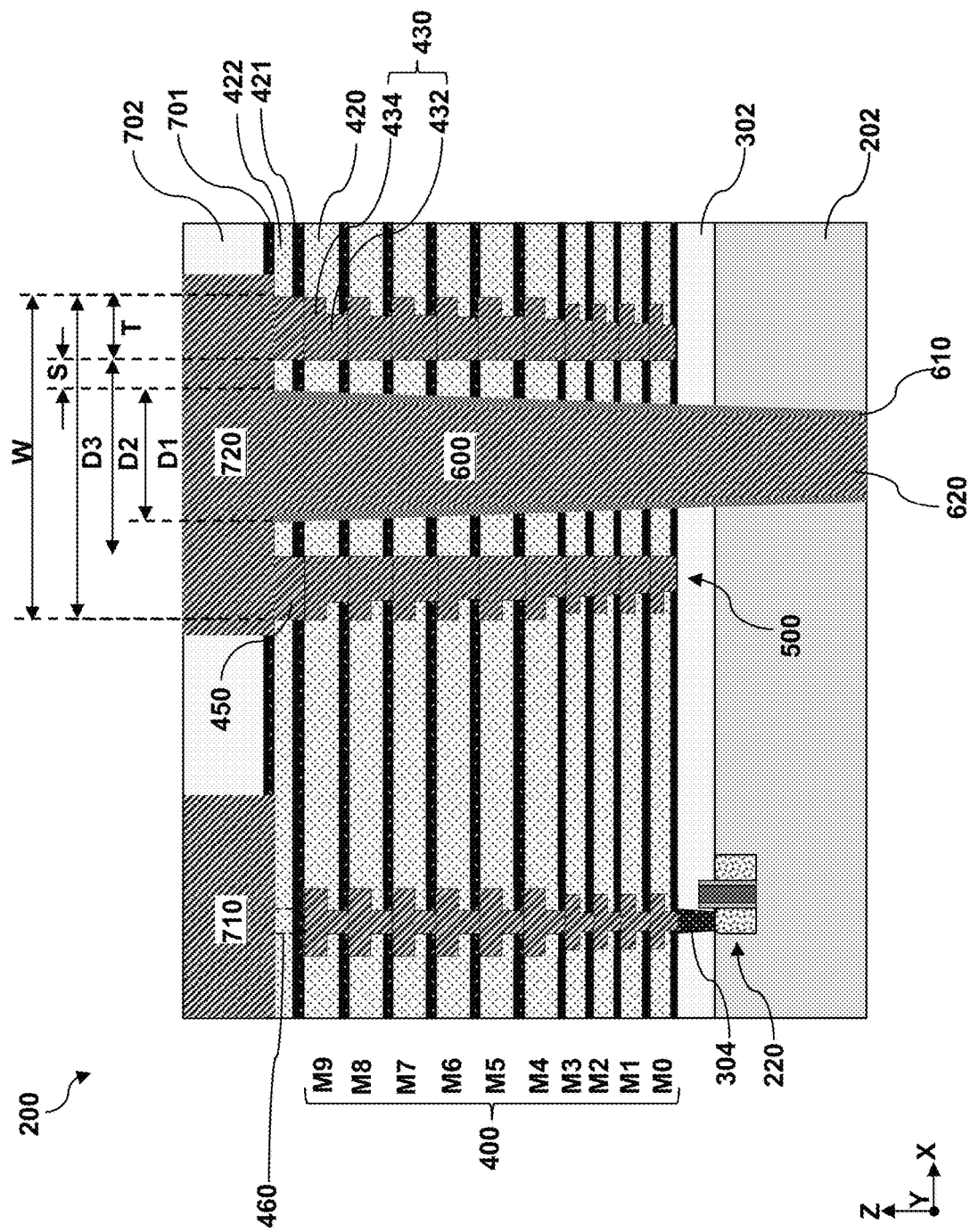

Referring to FIGS. 1 and 13, method 100 includes a block 124 where further processes are performed. Such further processes may include grinding and polishing the substrate 202 to expose a bottom surface of the via structure 600. Once the bottom surface of the via structure 600 is exposed, the via structure 600 extends completely through the interconnect structure 400 and the substrate 202.

Figure 14:
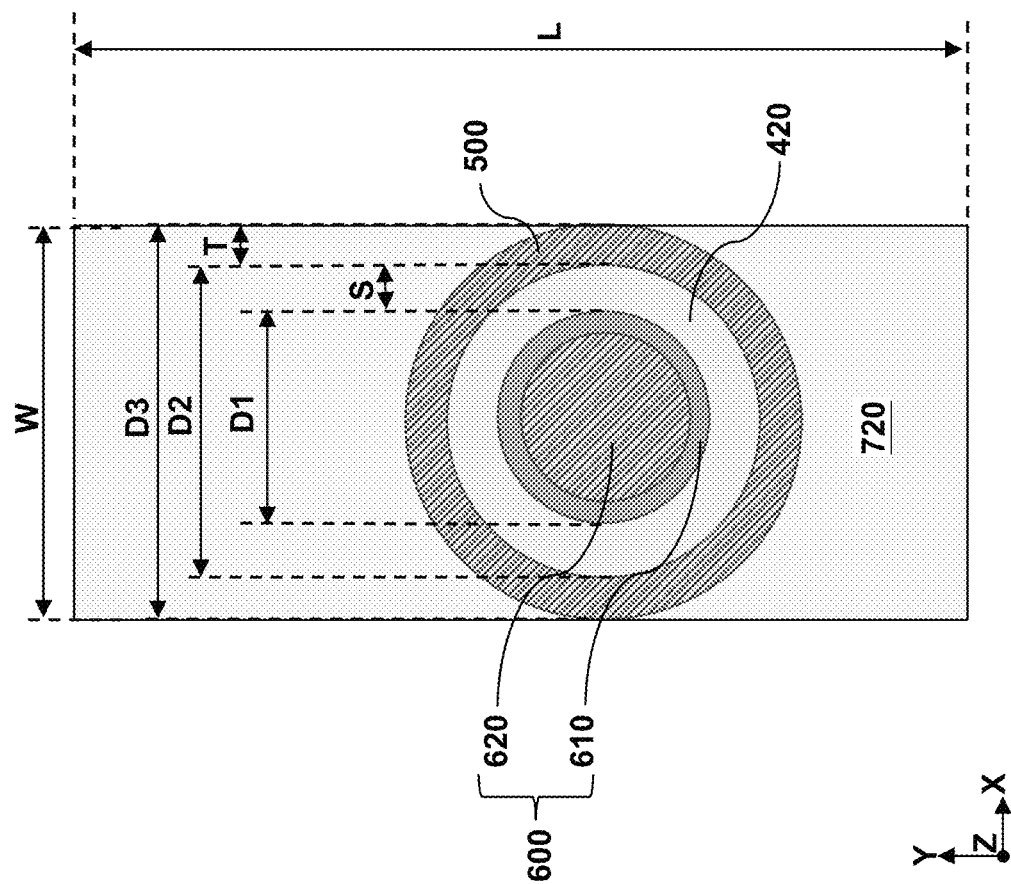
FIG. 14 is a fragmentary see-through top view of the workpiece shown in FIG. 13, according to various aspects of the present disclosure.

Reference is then made to FIG. 14, which illustrates a fragmentary see-through top view of the workpiece 200 in FIG. 13. In the depicted embodiments, the top metal feature 720 extends lengthwise for a length L along the Y direction. As shown in FIG. 14, the length L is such that the top metal feature 720 at least covers the guard ring structure 500 along the Y direction. In the depicted embodiment, the top metal feature 720 overhangs the guard ring structure 500 along the Y direction as well. Put differently, the top metal feature 720 partially or completely overlaps the guard ring structure 500.

In embodiments where the guard ring structure 500 is substantially cylindrical with an axis extending along the Z direction. The guard ring structure 500 completely surrounds a portion of the via structure 600 disposed in the interconnect structure 400 on the X-Y plane. Additionally, because the top metal feature 720 is physically coupled to the top surfaces of the via structure 600 and the coupling feature 450, the top metal feature 720 and the coupling feature 450 bring the guard ring structure 500 and the via structure 600 to the same potential, thereby eliminating the parasitic capacitance. The residual IMD layers and ESLs in the spacing S serves as cushion between the guard ring structure 500 and the via structure 600, thereby preventing the stress generated by the via structure to damage surrounding structures.

In one exemplary aspect, the present disclosure is directed to an integrated circuit (IC) structure. The IC structure includes a substrate, an interconnect structure over the substrate, a guard ring structure disposed in the interconnect structure, a via structure vertically extending through the guard ring structure, and a top metal feature disposed directly over and in contact with the guard ring structure and the via structure. The guard ring structure includes a plurality of guard ring layers. Each of the plurality of guard ring layers includes a lower portion and an upper portion disposed over the lower portion. Sidewalls of the lower portions and upper portions of the plurality of guard ring layers facing toward the via structure are substantially vertically aligned to form a smooth inner surface of the guard ring structure.

In some embodiments, the via structure and the guard ring structure are substantially circular when viewed along a direction perpendicular to a top surface of the substrate. In some embodiments, the upper portion is wider than the lower portion along a radial direction of the via structure. In some implementations, the upper portion overhangs the lower portion. In some embodiments, the via structure includes copper. In some instances, the guard ring structure includes copper. In some embodiments, the top metal feature is elongated. In some embodiments, the top metal feature includes aluminum, copper, or an alloy thereof.

In another exemplary aspect, the present disclosure is directed to an integrated circuit (IC) structure. The IC structure includes a substrate, an interconnect structure over the substrate. The interconnect structure includes a plurality of etch stop layers, a plurality of intermetal dielectric (IMD) layers interleaving the plurality of etch stop layers, and a plurality of guard ring layers stacked one over another to form a guard ring structure, each of the plurality of guard ring layers being disposed within one of the plurality of etch stop layers and one of the plurality of IMD layers immediately overlying the one of the plurality of etch stop layers. The IC structure further includes a via structure vertically extending through the guard ring structure; and a top metal feature disposed directly over and in contact with the guard ring structure and the via structure.

In some embodiments, the via structure and the guard ring structure are substantially circular when viewed along a direction perpendicular to a top surface of the substrate. In some implementations, along a radial direction of the via structure, the via structure is spaced apart from the guard ring structure by the plurality of etch stop layers and the plurality of IMD layers. In some instances, along a radial direction of the via structure, the via structure is spaced apart from the guard ring structure a spacing between about 0.2 µm and about 0.5 µm. In some instances, each of the plurality of guard ring layers includes a lower portion and an upper portion disposed over the lower portion, and sidewalls of the lower portions and upper portions of the plurality of guard ring layers facing toward the via structure are substantially vertically aligned to form a smooth inner surface of the guard ring structure. In some instances, the upper portion is wider than the lower portion along a radial direction of the via structure. In some embodiments, the via structure includes a barrier layer and a metal fill layer, the barrier layer includes titanium nitride, and the metal fill layer includes copper. In some instances, the top metal feature is elongated along a direction parallel to a top surface of the substrate and the top metal feature includes aluminum, copper, or an alloy thereof.

In yet another exemplary aspect, the present disclosure is directed to a method. The method includes forming over a substrate an interconnect structure. The interconnect structure includes a plurality of etch stop layers, a plurality of intermetal dielectric (IMD) layers interleaving the plurality of etch stop layers, and a plurality of guard ring layers stacked one over another to form a guard ring structure, each of the plurality of guard ring layers being disposed within one of the plurality of etch stop layers and one of the plurality of IMD layers immediately overlying the one of the plurality of etch stop layers. The method further includes etching an opening through the plurality of etch stop layers, the plurality of IMD layers and a portion of the substrate, forming a via structure within the opening, depositing a dielectric layer over the via structure and the guard ring structure, and forming a top metal feature in the dielectric layer such that the top metal feature spans over and directly contacts the via structure and the guard ring structure.

In some embodiments, the opening and the guard ring structure are circular when viewed along a direction perpendicular to the substrate, the opening includes a first diameter and the guard ring structure includes a second diameter, and the second diameter is greater than the first diameter by between 0.4 μm and about 1.0 μm. In some implementations, along a radial direction of the via structure, the via structure is spaced apart from the guard ring structure a spacing between about 0.2 μm and about 0.5 μm. In some instances, the etching includes etching through the plurality of etch stop layers and the plurality of IMD layers using a first etch process to form a pilot opening, extending the pilot opening into the substrate using a second etch process different from the first etch process, and smoothing surfaces of the extended pilot opening using a third etch process to form the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
a substrate;
an interconnect structure over the substrate;
a guard ring structure disposed in the interconnect structure;
a via structure vertically extending through the guard ring structure; and
a top metal feature disposed directly over and in contact with the guard ring structure and the via structure,
wherein the guard ring structure comprises a plurality of guard ring layers,
wherein each of the plurality of guard ring layers comprises a lower portion and an upper portion disposed over the lower portion,
wherein sidewalls of the lower portions and upper portions of the plurality of guard ring layers facing toward the via structure are substantially vertically aligned to form a smooth inner surface of the guard ring structure.

2. The IC structure of claim 1, wherein the via structure and the guard ring structure are substantially circular when viewed along a direction perpendicular to a top surface of the substrate.

3. The IC structure of claim 2, wherein the upper portion is wider than the lower portion along a radial direction of the via structure.

4. The IC structure of claim 1, wherein the upper portion overhangs the lower portion.

5. The IC structure of claim 1, wherein the via structure comprises copper.

6. The IC structure of claim 1, wherein the guard ring structure comprises copper.

7. The IC structure of claim 1, wherein the top metal feature is elongated.

8. The IC structure of claim 1, wherein the top metal feature comprises aluminum, copper, or an alloy thereof.

9. An integrated circuit (IC) structure, comprising:
a substrate;
an interconnect structure over the substrate, the interconnect structure comprising:
a plurality of etch stop layers,
a plurality of intermetal dielectric (IMD) layers interleaving the plurality of etch stop layers, and
a plurality of guard ring layers stacked one over another to form a guard ring structure, each of the plurality of guard ring layers being disposed within one of the plurality of etch stop layers and one of the plurality of IMD layers immediately overlying the one of the plurality of etch stop layers;
a via structure vertically extending through a center of the guard ring structure; and
a top metal feature disposed directly over and in contact with a top surface of the guard ring structure and a top surface of the via structure.

10. The IC structure of claim 9,
wherein the via structure and the guard ring structure are substantially circular when viewed along a direction perpendicular to a top surface of the substrate,
wherein the guard ring structure completely surrounds the via structure when viewed along the direction.

11. The IC structure of claim 10, wherein, along a radial direction of the via structure, the via structure is spaced apart from the guard ring structure by the plurality of etch stop layers and the plurality of IMD layers.

12. The IC structure of claim 10, wherein, along a radial direction of the via structure, the via structure is spaced apart from the guard ring structure a spacing between about 0.2 μm and about 0.5 μm.

13. The IC structure of claim 9,
wherein each of the plurality of guard ring layers comprises a lower portion and an upper portion disposed over the lower portion,
wherein sidewalls of the lower portions and upper portions of the plurality of guard ring layers facing toward the via structure are substantially vertically aligned to form a smooth inner surface of the guard ring structure.

14. The IC structure of claim 13, wherein the upper portion is wider than the lower portion along a radial direction of the via structure.

15. The IC structure of claim 9,
wherein the via structure comprises a barrier layer and a metal fill layer,
wherein the barrier layer comprises titanium nitride,
wherein the metal fill layer comprises copper.

16. The IC structure of claim 9,
wherein the top metal feature is elongated along a direction parallel to a top surface of the substrate,
wherein the top metal feature comprises aluminum, copper, or an alloy thereof.

17. A semiconductor structure, comprising:
a substrate;
an interconnect structure over the substrate;
a guard ring structure disposed in and extending through the interconnect structure;
a via structure vertically extending through a center of the guard ring structure and into the substrate such that the via structure is surrounded by the guard ring structure; and
a top metal feature disposed directly over and in contact with top surfaces of the guard ring structure and the via structure,
wherein the guard ring structure comprises a smooth inner surface.

18. The semiconductor structure of claim 17
wherein the guard ring structure comprises a plurality of guard ring layers,
wherein each of the plurality of guard ring layers comprises a lower portion and an upper portion disposed over the lower portion,
wherein sidewalls of the lower portions and upper portions of the plurality of guard ring layers facing toward the via structure are substantially vertically aligned.

19. The semiconductor structure of claim 18, wherein sidewalls of the lower portions and upper portions of the plurality of guard ring layers facing away from the via structure are not vertically aligned.

20. The semiconductor structure of claim 17,
wherein a sidewall of the via structure is spaced apart the smooth inner surface of the guard ring structure by a spacing,
wherein the spacing is between about 0.2 μm and about 0.5 μm.

* * * * *